Jan. 20, 1970 J. L. SPRAGUE 3,490,963

PRODUCTION OF PLANAR SEMICONDUCTOR DEVICES
BY MASKING AND DIFFUSION

Original Filed May 18, 1964

INVENTOR

John L. Sprague

BY Connolly and Hutz

ATTORNEYS

United States Patent Office
3,490,963
Patented Jan. 20, 1970

3,490,963

PRODUCTION OF PLANAR SEMICONDUCTOR DEVICES BY MASKING AND DIFFUSION

John L. Sprague, Williamstown, Mass., assignor to Sprague Electric Company, North Adams, Mass., a corporation of Massachusetts Continuation of application Ser. No. 368,220, May 18, 1964. This application Feb. 27, 1967, Ser. No. 619,068
Int. Cl. H01l 7/44, 7/36
U.S. Cl. 148—187 3 Claims This is a continuation of application 368,220, filed May 18, 1964, now abandoned.

This invention relates to a process for producing semiconductive devices of planar configuration, and more particularly to improvement of the process for producing junctions and contacts in a planar semiconductor device.

Planar devices of the prior art have been prepared by diffusion of one or more impurities into a semiconductor body to provide zones of different conductivity types separated by rectifying junctions which extend to a surface of the body. Overlying the junctions on the semiconductor body surface is an insulating coating which functions to protect the junctions from electrical shorting or damage during manufacture and use of the device.

One of the purposes of the insulating coating on planar devices is the protection (passivation) of the junction in order to provide the best possible electrical performance in the produced device. It is well known that the junction is particularly vulnerable to contamination or degradation during the process of preparing the semiconductor device. Another function of the insulating coating is to provide an insulating base for the deposition of conductive leads between devices on the same semiconductor body, as well as providing a base for terminal leads from any of the devices to areas remote from the devices so as to facilitate the attachment of external connectors.

It has been considered essential to retain the insulating coating on the junction and to try to provide a structure wherein inadvertent shorting (bridging across the junction) or damage is precluded. The retention of the insulating coating on the common surface over the junction has been intended to protect the junction from inadvertent shorting or damage during subsequent processing and use. This procedure in turn provides certain undesirable side effects, because the original protective or insulating coating is contaminated with indiffusing impurities and contaminants during the subsequent processing steps. During the lengthy period that the resultant product is in use, the incorporated impurities and contaminants eventually take effect and introduce contamination and degradation at the vulnerable junction. Furthermore, it has been found that pinholes, imperfections, and discontinuities are introduced in the originally perfect insulating coating during the subsequent processing of the device structure. During deposition of the conductive contact and/or inter-connection material these pinholes, imperfections, and discontinuities in the insulating material on which the conductive contact and/or inter-connection material is deposited can cause shorting of this material to the substrate semiconductor and therefore failure of the device structure. Furthermore, imperfections and discontinuities in the insulating material can cause similar failure in the contact and/or interconnection material and so lead to subsequent failure of the device structure. Thus, the purpose of the insulating coating is eventually defeated.

It is desirable to provide a process in the preparation of a semiconductor device of planar configuration to protect the junction during production and at the same time provide a completed unit with a junction or junctions free from the incipient danger of subsequent damage of contamination or degradation, and a planar surface free from contamination.

It is the object of this invention to provide a method for producing a semiconductor device of planar configuration with the common surface at the junction free of impurities and contaminants.

It is another object of this invention ot produce a planar semiconductor device having an insulating coating that provides a substrate on which the contacts and/or connectors are deposited without danger of even high resistance contact with the surface of the semiconductor.

It is a further object of this invention to provide a method of producing a semiconductor device of planar configuration in which the common planar surface at the junction is treated to improve the junction characteristics of the resultant device and subsequently the contacts are suitably applied to the respective zones of the junction through etch holes in a protective insulating coat.

These and other objects of this invention will become more apparent upon consideration of the following description taken together with the accompanying drawings, in which.

Figure 1:
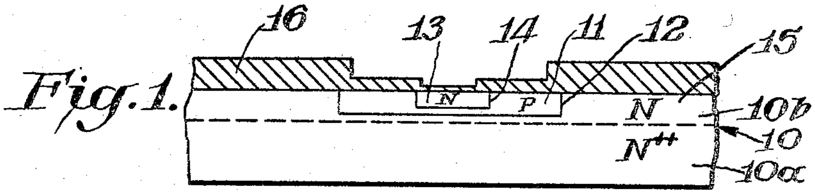
FIGURE 1 is a sectional view through a semiconductor body at an intermediate stage of manufacture of a planar device in accordance with the present invention.

In general, the improved procedure of this invention involves the removal of the protective coating that has been present on a semiconductor body of planar configuration throughout the production of the zones and rectifying junctions by means of the various masking, etching, and diffusion steps of the planar process. This invention provides for the improvement of the junction characteristics by eliminating any impurities which collect at the semiconductor body surface during the processing steps in the preparation of the planar configuration, and then re-passivating the common planar surface with a new protective coating for the rectifying junctions, followed by the production of holes in the protective coating, and the application of contacts to the respective zones through these holes.

The process of this invention involves first producing a planar configuration on a semiconductor body by the indiffusion of impurities. In the following specific embodiment, the invention is described as applied to a planar configuration involving double diffusion. It will be understood that some microcircuits require many more than two diffusion steps.

A suitable semiconductor body for illustration of this invention is a wafer of N-type silicon. An insulating coating is produced on the upper surface of the wafer, as for example, a coating of silicon dioxide. Any well known suitable method of producing this coating is adequate, provided there is as little contamination or inclusion of impurities as is reasonably possible. A photo-resist mask is applied to the oxide coating. The oxide coating is then etched in a limited area to provide an aperture through the oxide layer to the surface of the semiconductor wafer. An impurity is diffused through the aperture into the silicon wafer. In this example the impurity is an acceptor impurity and is diffused by heating so as to produce a P-type region in the silicon wafer. A rectifying junction is formed between the zone of P-type silicon and the zone of N-type silicon. This rectifying junction extends to the surface of the wafer which is common to the two zones. Thus, a planar configuration is produced.

An insulating coating is reformed on the surface of the semiconductor wafer in the aperture such as, for example, by thermal oxidation. Thus, an insulating coating over the entire surface of the wafer is reestablished. A photo-resist mask is then applied to part of the newly formed insulating coating leaving an area of the silicon dioxide insulating coating uncovered. Hydrofluoric acid etching of the silicon oxide through the uncovered area forms an aperture in the insulating coating at this uncovered area. Further diffusion of an N-type impurity into the P-type one is carried out in the same manner as the first diffusion described above. A second rectifying junction defines the second N-type zone within the P-type zone. This second rectifying junction also extends to the common planar surface and thus provides with the first rectifying junction three zones and two rectifying junctions in the common planar surface. While this specific example is described in terms of a single NPN device being formed in the semiconductor wafer, it is to be understood that a PNP device or a plurality of like or complementary devices could be produced in the wafer with conductive leads extending therebetween by any multiplicity and sequence of diffusion steps.

The protective silicon dioxide insulating coating contains a number of contaminants and impurities by the time the various masking, etching, and diffusing steps have been completed. Previously this coating has been maintained in place as a permanent element in the finished product and removal has been avoided in the belief that the junctions should never be exposed. According to the present invention, the silicon dioxide protective coating containing the impurities and contaminants of the various diffusion and etching steps is etched off the common planar surface. Further the silicon surface of the semiconductor wafer itself is lightly etched with a suitable etch solution to improve the characteristics and remove impurities which have collected at the silicon surface and at the silicon/silicon dioxide interface during the above mentioned process. The common planar surface is then repassivated as by thermal oxidation or by formation or deposition of any appropriate insulating material, to produce a single homogeneous layer of silicon dioxide or other appropriate insulating material on the common planar surface. Although thermal oxidation is preferred because of its simplicity, any other known passivating technique may be employed to form insulating coatings such as silicon dioxide or silicon nitride. This silicon dioxide layer serves as an insulating layer and a protective covering. It may also be produced by any other suitable technique. A photo-resist mask is then applied to the coating of silicon dioxide leaving exposed areas thereof over the respective zones. An etching procedure forms holes through the silicon dioxide coating and suitable contacts are attached to the respective zones. In this specific example these contacts are the base and emitter the contacts for the resultant transistor.

Referring to the figures, FIGURE 1 illustrates a semiconductor wafer in which three zones of conductivity have been produced. These three zones of conductivity are produced by masking and indiffusion techniques described above. A wafer 10 is a semiconductor body having a substrate 10*a* of N-type silicon carrying an epitaxial layer 10*b* of a higher resistivity N-type silicon. The epitaxial layer 10*b* has formed in it a P-type zone 11 separated from the N-type zone 10*b* by a rectifying junction 12. The P-type zone 11 has formed in it an N-type zone 13 separated from the P-type zone 11 by a rectifying junction 14. The junctions 12 and 14 extend to a surface 15 of the N-type layer 10*b* and the junctions 12 and 14. A planar configuration is provided by the three zones 10*b*, 11 and 13 and by the respective junctions 12 and 14 at the common planar surface. A protective and insulating coating 16 of silicon dioxide overlies the common surface 15.

Figure 2:
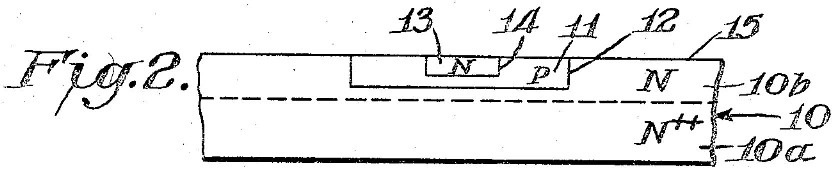
FIGURE 2 is a sectional view through a semiconductor body at a further stage of manufacture showing three zones and two rectifying junctions of a planar configuration.

According to this invention the insulating coating 16 is next removed from the surface 15. As illustrated in FIGURE 2, the wafer 10 has a bare planar surface. The surface 15 is subjected to a controlled etching with a suitable etch solution known to the semiconductor art. One such solution is made up of one part of concentrated hydrochloric acid, one part of concentrated nitric acid and forty parts of glacial acetic acid. The etch is carried on so as to remove a thin layer at the silicon surface 15 and with it the impurities which collect therein as a result of the preceding steps.

Figure 3:
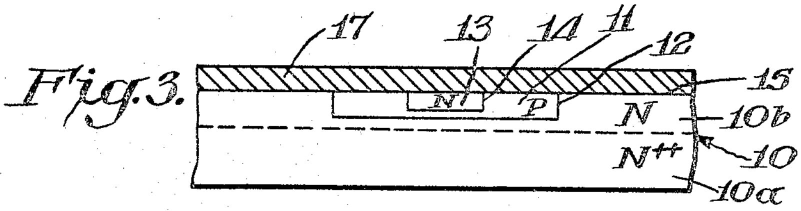
FIGURE 3 is a sectional view of the body of FIGURE 2 having an insulating coating on a common planar surface.

The surface 15 is then covered as illustrated in FIGURE 3 in a re-passivating step in which a protective coating 17 is applied, as by thermal oxidation. As set forth above, any known passivating coating is within the scope of this invention; the nature of the coating being secondary to the concept of providing a new coating that has not been subject to the preceding processing steps. Thus, the common planar surface 15 with its junctions 14 and 12 is covered by the continuous coating 17. The surface 15 is free of impurities and contaminants. It will remain so indefinitely under the protective coating 17.

Figure 4:
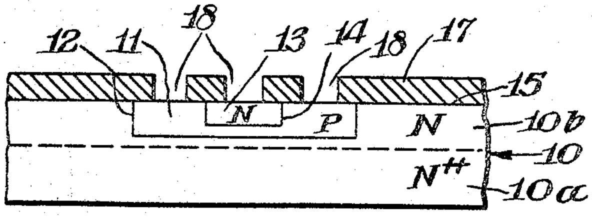
FIGURE 4 is a sectional view through the body of FIGURE 3 with etch holes in the insulating coating at each of the respective zones.
Figure 5:
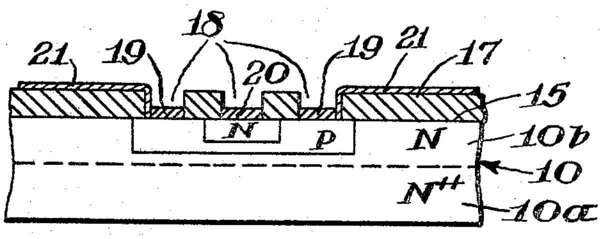
FIGURE 5 is a sectional view through the body of FIGURE 4 with contacts applied to the respective zones in the etched holes and conductive leads overlying the insulating coating.

Next, a photo-resist mask is applied to the surface of coating 17 leaving openings for the formation of apertures through the layer 17. Subsequent etching of the layer 17 produces aperture 18 as illustrated in FIGURE 4. The base contact 19 and the emitter contact 20 are then applied to the respective P-type and N-type zones, as by metalization. In those applications requiring the use of conductive leads, such as interdigitated devices and microcircuits, conductive paths 21 are applied over the new coating 17 with a vastly improved degree of assurance of not encountering pinholes, imperfections, and discontinuities of the type that were present in processing coating 16. The semiconductor device with the contacts and the conductive leads thus attached is then in condition for final processing.

It will be understood that the above-described embodiment has been set forth for the purpose of illustration only and that various modifications may be made by persons skilled in the art without departure from the spirit of this invention which is defined only by the scope of the appended claims.

I claim:

1. In the process of producing a semiconductor device comprising forming a non-conducting coating on the surface of a semiconductor body, opening a plurality of apertures through said coating, diffusing an impurity through said apertures into said body thereby forming a plurality of P-N junctions extending to said surface underneath said coating; the improvement which comprises removing at least part of the coating to expose the semiconductor surface after forming said junctions, removing a thin layer of semiconductor at the exposed surface so as to remove substantially all contaminants on said surface and then recovering the new surface with a homogeneous insulating coating of silicon nitride substantially free from imperfections and contamination.

2. In the process of producing a semiconductor device as claimed in claim 1, the step of next depositing a metallization on the silicon nitride insulating coating.

3. The method of producing a planar semiconductor device comprising the steps of covering a portion of a surface of a semiconductor body of a given conductivity type with a non-conducting oxide coating, opening an aperture through said coating, diffusing an opposite type impurity into the semiconductor body through the aperture to form an opposite conductivity type region adjacent said surface, removing said non-conducting coating from said surface, treating said surface with a controlled etch acid solution capable of removing impurities collected at the surface, recovering the new common planar surface with a new and different protective non-conducting coating comprising silicon nitride in a passivating amount.

References Cited

UNITED STATES PATENTS

| | | | |
|---|---|---|---|
| 2,953,486 | 9/1960 | Atalla | 148—191 |
| 3,085,033 | 4/1963 | Handelman | 148—191 |
| 3,147,152 | 9/1964 | Mendel | 148—187 |
| 3,165,430 | 1/1965 | Hugle | 148—187 |
| 3,184,823 | 5/1965 | Little et al. | 148—187 |
| 3,200,019 | 8/1965 | Scott et al. | 148—187 |
| 3,245,848 | 4/1966 | DeVaux | 148—189 |
| 3,281,915 | 11/1966 | Schramm | 148—187 |
| 3,183,128 | 5/1965 | Leistiko | 148—187 |
| 3,197,681 | 7/1965 | Broussard | 148—187 |

FOREIGN PATENTS

| | | |
|---|---|---|
| 920,306 | 3/1963 | Great Britain. |

HYLAND BIZOT, Primary Examiner